United States Patent [19]

Thoma

[11] Patent Number: 5,372,750
[45] Date of Patent: Dec. 13, 1994

[54] ELECTRICALLY CONDUCTIVE SCREEN PRINTABLE COMPOSITIONS AND METHOD OF MAKING THE SAME

[75] Inventor: Paul E. Thoma, Cedarburg, Wis.

[73] Assignee: Johnson Service Company, Milwaukee, Wis.

[21] Appl. No.: 168,576

[22] Filed: Dec. 16, 1993

Related U.S. Application Data

[63] Continuation of Ser. No. 943,754, Sep. 11, 1992, abandoned.

[51] Int. Cl.$^5$ .................... H01B 12/06; H01L 21/16
[52] U.S. Cl. ..................... 252/512; 252/511; 252/514; 252/502; 252/518; 106/1.18; 106/1.25
[58] Field of Search ............... 252/502, 511, 512, 514, 252/518; 106/1.18, 1.25

[56] References Cited

U.S. PATENT DOCUMENTS

| | | | |
|---|---|---|---|
| 4,596,670 | 6/1986 | Liy | 252/511 |
| 4,896,250 | 1/1990 | Sullivan | 361/523 |
| 5,164,133 | 11/1992 | Ishida et al. | 264/105 |
| 5,177,662 | 1/1993 | Thoma | 361/286 |

*Primary Examiner*—Paul Lieberman
*Assistant Examiner*—Greg Delcotto
*Attorney, Agent, or Firm*—Foley & Lardner

[57] ABSTRACT

An electrically conductive composition useful, for example, in screen printing applications, includes a thermoplastic resin binder, electrically conductive particles and a solvent. The preferred composition includes a polysulfone thermoplastic resin, silver flakes or carbon black as the conductive particles and butyrophenone as the solvent. The preferred manufacturing process includes adding the resin in two batches at separate time periods during the mixing of the components. The composition is particularly suitable for fusion at high temperatures, such as in screen printed electrical contacts for use in capacitance humidity sensors.

9 Claims, No Drawings

ELECTRICALLY CONDUCTIVE SCREEN PRINTABLE COMPOSITIONS AND METHOD OF MAKING THE SAME

CROSS-REFERENCES TO RELATED APPLICATION

This is a continuation of application Ser. No. 07/943,754 filed Sep. 11, 1992 abandoned.

BACKGROUND OF THE INVENTION

1. Field of the Invention

The present invention relates to the field of electrically conductive printable materials, and more particularly to materials which may be used for electrical components requiring curing at high temperatures, for example at 200° C. to 275° C. or higher. Still more specifically, the present invention relates to an electrically conductive composition which includes a thermoplastic resin binder, conductive particles dispersed therein and a solvent. Still more particularly, in connection with the manufacturing techniques, the thermoplastic resin is added in two different stages during the dispersion process to improve the properties of the final product.

2. Description of the Prior Art

Electrically conductive printable compositions have numerous applications. Electrically conductive printable compositions are used in the capacitance humidity sensor which is the subject of co-pending, commonly assigned U.S. patent application Ser. No. 07/831,553 filed in the name of Paul E. Thoma on Feb. 5, 1992. In this device, a polyimide film is mounted to a frame and is screen printed with first and second layers of conductive material which are then fused to the polyimide layer. A conductive ink is then screen printed onto the conductive layers and fused to provide an electrical contact. The conductive ink used in the prior devices of the type described in the aforementioned patent application was Polymer Conductor P-2313 manufactured by EMCA-REMEX Products of Montgomeryville, Pa. A Technical Information Bulletin on this material is included with this application for patent. This material is a silver containing ink having a sheet resistance of 0.060 ohms/square/14 microns cured, a viscosity of 30,000 cps ±10,000 cps at 25° C. using a Brookfield HBT Viscometer with 13 R small sample adapter chamber and #27 spindle at 10 rpm. The cure schedule for this material calls for 165° C. for 30 minutes in a circulating air convection oven or belt furnace.

One of the problems with this material is that the low cure temperature is not suitable for some applications. For example, the fusion temperature used in the process for manufacturing a capacitance humidity sensor has typically been 250° C. It has been determined that this cure temperature results in poor adhesion of the capacitor's plates to the dielectric layer beneath the silver ink of the prior description. One way to overcome the problem would be to change the oven temperatures, but changing the oven temperature may result in long holds in the process, and the chance for processing the sensors at an incorrect temperature is also greater when the oven temperature is being changed for different parts of the process.

There are two other relatively undesirable aspects of the P-2313 material. One is its relatively short shelf life of four (4) months when stored at 5° C. and the relatively wide viscosity range, i.e. ±10,000 cps with a starting viscosity of 30,000 cps. In other words, the potential range of viscosity is between 20,000–40,000 cps.

It would be desirable to have an electrically conductive composition suitable for screen printing applications which could be fused or cured at higher temperatures. Desirably, the composition would have no chemical reactions involved in its preparation and have a relatively simple manufacturing process, a long shelf life and form a strong adhesive bond between the fused composition and a variety of substrates, including polyimides. Such a composition would represent a significant advance in this technology.

SUMMARY OF THE INVENTION

The present invention features an electrically conductive printable composition which can be made by a relatively simple process and which can be cured at higher temperatures to provide a strong adhesive bond with a variety of substrates.

Other features of the conductive composition of the present invention are a long shelf life and predictable viscosities when following the manufacturing procedures to be described later herein.

Yet another feature of the present invention is the manufacture of a conductive composition using a single solvent, electrically conductive particles and a single thermoplastic resin, although combinations of materials could be used without departing from the intended scope of the invention.

How these and other features of the invention are accomplished will be described in the following detailed description of the preferred embodiment. Generally, however, they are accomplished by providing a conductive composition which includes a thermoplastic resin, electrically conductive particles (for example silver flakes or carbon particles) and a solvent and by providing a manufacturing process which includes a two step addition of the thermoplastic resin to aid in the dispersion of the conductive particles and to control the viscosity of the final product. The resulting composition provides a strong cohesive bond between itself and substrates to which it is applied, especially on substrates which also include the same polymeric material used in the manufacture of the composition. In such cases, the thermoplastic material may intermingle with the molecules of the substrate, resulting in the development of an integral cohesive bond after the evaporation of the solvent.

DETAILED DESCRIPTION OF THE PREFERRED EMBODIMENT

Before proceeding to the detailed description of the preferred embodiment and the preferred manufacturing techniques for making it, several general comments should be made about the materials useful in the present invention. With regard to the thermoplastic polymer, polysulfone materials are preferred, especially AMOCO P-1835 polysulfone which has a published glass transition temperature of 190° C. Other thermoplastic polymers which could be used in the conductive composition of the present invention include polyarylsulfone resins, polyethersulfone resins, polycarbonate resins, polyphenylene oxide resins and cellulose acetate resins.

Electrically conductive particles useful in the present invention include flakes, spheres, dendrites, regularly shaped particles, whiskers and needles of electrically conductive materials, such as metals (silver, copper, nickel), alloys (silver-gold, copper-nickel), composites (silver coated nickel, silver coated graphite), and electrically conductive non-metals (carbon blacks, graphite). These materials are mentioned for purposes of illustration only. A most preferred electrically conductive particle is a silver flake particle having an average particle size of less than 10 microns, such as the silver flake product available from Aldrich Chemical Company, Catalog No. 32,707-7 and from Degussa Corporation—Metz Division, Catalog No. SF-65. Another preferred electrically conductive particle is a chaining carbon black, Vulcan XC-72, available from Cabot Corporation that has been deoxidized.

Finally, with regard to the solvents which may be used, one characteristic is the ability to dissolve the thermoplastic polymer. Another is to serve as a carrier for the electrically conductive particles. Suitable solvents for polysulfone include butyrophenone, such as that available from Aldrich Chemical Company, Catalog No. 12,433-8. Other solvents which may be used for polysulfone include other alkylphenones, halogenated hydrocarbons such as bromochloromethane and chloroform, and cyclic ketones such as cyclopentanone and cylcohexanone. Other solvents may be used for other thermoplastic resins as would, in and of itself, be generally known to those skilled in the art.

The present invention can best be understood by proceeding with a detailed description of the method of making an electrically conductive polysulfone-silver ink which constitutes a preferred embodiment of the invention. It should be apparent that proportions and times can be varied. It should also be appreciated that the conductive layers of the aforementioned humidity sensor can also be made using the techniques explained hereafter, substituting the carbon black, for example, for the silver flakes.

The preferred procedure for making the composition of the present invention begins by cleaning a glass bottle, preferably a bottle having a cover lined with Teflon®. Two foil measuring dishes are then cleaned with a suitable solvent, such as acetone, for subsequent use in the measuring of certain constituents.

The glass bottle and its cover are placed on a balance and tared. An initial quantity of butyrophenone is transferred with an automatic volumetric dispenser in a fume hood and the cover is placed on the bottle. The bottle, with contents, is now weighed, and the weight of the solvent is determined.

The next step is to weigh the desired amount of silver flake, using one of the aluminum foil dishes, and the silver flake is added to the glass bottle containing the butyrophenone. The second foil dish is balanced and tared and a first predetermined quantity of polysulfone powder is then weighed using the procedures for the other two constituents. The polysulfone powder is then added to the glass bottle containing the butyrophenone and silver flake.

The next step in the process constitutes placing the sealed bottle on a ball mill and rotating the bottle on the ball mill for a predetermined amount of time. In my most preferred embodiment, I rotate the bottle on the ball mill for at least twenty-four (24) hours.

After mixing, the bottle is removed from the ball mill and placed back in the fume hood. A third foil dish is cleaned with a solvent, balanced and tared, and the second predetermined amount of polysulfone powder is added to the dish and its weight is recorded. This additional quantity of polysulfone powder is added to the glass bottle and the bottle is sealed. The second mixing step, again for a predetermined time, is undertaken. The speed of rotation on the ball mill used to prepare test samples for the development of the present invention was approximately 15-20 rpm. Following completion of this step, the viscosity of the polysulfone-silver ink is measured at room temperature, using a Brookfield RVT Viscometer, with a 13 R small adapter chamber and a No. 27 spindle at 5 rpm.

Several of the steps, including those which involve handling of butyrophenone and silver flake are conducted carefully to avoid operator contact and are conducted in a fume hood due to potential toxicity problems with these two components. Care should be exercised to avoid inhaling or touching the silver flake or inhaling fumes from the butyrophenone. Care should also be undertaken to avoid heat around silver dust, as it is a flammable solid and is reactive in air. Preferably, it should be stored under nitrogen.

It should be noted that in the manufacturing process described above, the polysulfone is added in two steps. The purpose of the first addition is to provide sufficient polysulfone in the solution to keep the conductive particles in suspension. The amount of polysulfone in the first step must also be sufficiently low to maintain a low solution viscosity so the particles can be dispersed uniformly in the polysulfone/butyrophenone solution. A butyrophenone-polysulfone ratio that provides an adequate initial solution viscosity and keeps the particles in suspension during mixing is approximately 16.67 mls/gram. The ink compositions listed in Table I below have this ratio. The total amount of silver flake added must be kept sufficiently low to maintain an initial low solution viscosity to permit the silver flake dispersion. However, the amount of silver flake must also be sufficiently high to provide a printed and fused polysulfone-silver ink that has good electrical conductivity.

The second addition of polysulfone achieves the desired final viscosity for the illustrative polysulfone-silver ink, and during the second mixing step (after the second addition of polysulfone) the polysulfone gradually dissolves and the viscosity of the ink increases. The relatively low rotational speed allows the added polysulfone to uniformly mix in the ink as it dissolves.

A number of parameters influence the viscosity of the polysulfone-silver ink. These include the silver flake shape and size, the amount of silver flake dispersed in the ink, how well the flake is dispersed, the amount of polysulfone in the solution and the molecular chain length of the polysulfone. Since so many parameters influence the final ink viscosity, it is important to measure the ink's viscosity to verify the quality of the process.

The second addition of resin also results in an adjustment of the silver flake to polysulfone ratio and increases the viscosity of the initial polysulfone-silver ink so that the finished ink can be readily screen printed. The amount of polysulfone added influences the electrical conductivity of the printed and fused ink, and greatly affects the strength of the adhesive bond between the fused ink and the polyimide dielectric layer. Table II below shows the electrical properties obtained with six test solutions. Good electrical conductivity and a strong bond occur with a silver flake to polysulfone weight ratio of 4.5/1.0. The electrical resistivity and thickness of the printed and fused polysulfone-silver inks contained in Table I are listed in this Table II.

An ink viscosity between 20,000–40,000 cps is suitable for screen printing, and an ink viscosity of 25,000±5,000 cps is desirable so that a relatively thin contact can be used when a 325 mesh stainless steel screen is employed having 0.0005 inch emulsion thickness. My preferred solutions of those described in the two tables are those listed as number 5 and 6, having a viscosity of approximately 24,000 cps.

The adhesion of the inks prepared according to the above procedures and in the ratios shown in Table I was tested by using Scotch ® tape pressed over the fused polysulfone-silver inks. After fusion to a Upilex ® R polyimide film (0.0003 inch) and to polysulfone matrix conductive layers, the fused polysulfone-silver ink layer was not released from the substrate when the Scotch ® tape was pulled off the fused ink.

Set forth below in Table I are six (6) ink solutions prepared according to the techniques of the present invention, all having the 4.5:1 ratio referred to above. The conductive particle to resin ratio could vary between about 0.1:1 to about 10:1. Also, while the table lists compositions wherein the initial/final resin ratio is from about 0.15:1 to 0.20:1, that ratio could fluctuate from about 0.01:1 to about 0.8:1.

While the present invention has been described in detail in connection with certain preferred embodiments, the invention is not to be limited thereby but is to be limited solely by the scope of the claims which follow.

What is claimed is:

1. A method for making an electrically conductive composition comprising the steps of:
   a) mixing electrically conductive particles, a first quantity of a polysulfone resin and an alkylphenone solvent for the thermoplastic resin;
   b) interrupting the mixing and adding a second quantity of the polysulfone resin, the ratio of the first quantity of polysulfone resin to the second quantity of polysulfone resin ranging from about 0.01:1 to about 0.8:1 and the ratio of conductive particles to the combined first and second quantities of polysulfone resin ranging from about 0.1:1 to 10:1; and
   c) mixing the ingredients resulting from step b, the quantity of solvent being sufficient to maintain the conductive particles in suspension during mixing.

2. The method of claim 1, wherein the solvent is butyrophenone.

3. The method of claim 1, wherein the electrically conductive particles are selected from the group consisting of flakes, spheres, dendrites, needles, and chaining particles.

4. The method of claim 3, wherein the electrically conductive particles are flakes having an average particle size of 10 microns or less.

5. The method of claim 1 or 3, wherein the electrically conductive particles are chaining carbon black particles.

6. The method of claim 1, wherein the electrically conductive particles are selected from the group consisting of metals, alloys, metal on metal composites, metal on nonmetal composites, and electrically conductive nonmetals.

7. The method of claim 6, wherein the electrically conductive particles are silver flakes.

8. The method of claim 6 wherein the electrically conductive particles are chaining carbon black particles.

9. The method of claim 1, wherein the weight ratio of conductive particles to first quantity of resin is in the range of about 0.2:1 to 1000:1 and the weight ratio of conductive particles to resin in the final ink composition is in the range of about 0.1:1 to 10:1.

TABLE I

POLYSULFONE-SILVER INK FORMULATIONS

| | Ink Composition to Initially Disperse Silver Flake | | | Final Ink | | |
|---|---|---|---|---|---|---|
| Solution | Butyrophenone | Silver Flake | Polysulfone | Silver Flake-Polysulfone Ratio | Total Polysulfone | Second Addition Polysulfone |
| 1 | 25.0 mls | 42.75 g | 1.5 g | 4.5 | 9.5 g | 8.0 g |
| 2 | 25.0 mls | 39.375 g | 1.5 g | 4.5 | 8.75 g | 7.25 g |
| 3 | 25.0 mls | 36.0 g | 1.5 g | 4.5 | 8.0 g | 6.5 g |
| 4 | 25.0 mls | 33.75 g | 1.5 g | 4.5 | 7.5 g | 6.0 g |
| 5 | 50.0 mls | 67.5 g | 3.0 g | 4.5 | 15.0 g | 12.0 g |
| 6 | 50.0 mls | 67.5 g | 3.0 g | 4.5 | 15.0 g | 12.0 g |

Set forth in Table II below are the electrical characteristics of the six solutions shown in Table 1 and also showing the prior art material (P2313) determined experimentally and as shown in the Technical Information Bulletin. These fused inks were made using a 325 mesh stainless steel screen having a 0.0005 inch emulsion thickness, printing a resistor pattern on a 0.0003 inch thick polyimide film, and fusing the ink at 250° C. for 30 minutes in an oven.

TABLE II

ELECTRICAL CHARACTERISTICS

| Solution | Electrical Resistivity, Ω/□ | Thickness, inch | Electrical Resistivity, Ω/□/0.001 inch |
|---|---|---|---|
| 1 | 0.061 | 0.00024 | 0.015 |
| 2 | 0.062 | 0.00021 | 0.013 |
| 3 | 0.056 | 0.00022 | 0.012 |
| 4 | 0.070 | 0.00022 | 0.015 |
| 5 | 0.062 | 0.00019 | 0.012 |
| 6 | 0.064 | 0.00021 | 0.013 |
| EMCA-REMEX P2313 | 0.076 | 0.00018 | 0.013 Experimental |
| EMCA-REMEX Polymer Conductor P2313 | | | 0.030 (Tech. Inf. Sheet) |